(12) United States Patent
Shah et al.

(10) Patent No.: US 7,781,328 B2
(45) Date of Patent: Aug. 24, 2010

(54) MULTILAYER SUBSTRATE

(75) Inventors: Rajiv Shah, Rancho Palos Verdes, CA (US); Shaun Pendo, Santa Maria, CA (US); Edward B. Babiricki, Granada Hills, CA (US)

(73) Assignee: Medtronic Minimed, Inc., Northridge, CA (US)

( * ) Notice: Subject to any disclaimer, the term of this patent is extended or adjusted under 35 U.S.C. 154(b) by 186 days.

(21) Appl. No.: 11/868,898

(22) Filed: Oct. 8, 2007

(65) Prior Publication Data
US 2008/0026592 A1 Jan. 31, 2008

Related U.S. Application Data

(63) Continuation of application No. 10/845,002, filed on May 12, 2004, now Pat. No. 7,297,627.

(51) Int. Cl.
*H01L 21/4763* (2006.01)
(52) U.S. Cl. .................. 438/622; 438/737
(58) Field of Classification Search .......... 438/622, 438/737
See application file for complete search history.

(56) References Cited

U.S. PATENT DOCUMENTS

| | | |
|---|---|---|
| 3,224,433 A | 12/1965 | Hroch Von Dalebor |
| 3,224,436 A | 12/1965 | Massena |
| 3,294,653 A | 12/1966 | Keller et al. |
| 3,296,012 A | 1/1967 | Stalnecker, Jr. |
| 3,379,568 A | 4/1968 | Holmes |
| 3,637,406 A | 1/1972 | Bailey |
| 3,862,017 A | 1/1975 | Tsunemitsu et al. |
| 3,988,214 A | 10/1976 | Tsunemitsu |
| 4,250,519 A * | 2/1981 | Mogi et al. ............ 257/302 |

(Continued)

FOREIGN PATENT DOCUMENTS

EP 0 329 973 A1 8/1989

(Continued)

OTHER PUBLICATIONS

PCT International Search Report as issued in International Application No. PCT/US2003/029224 Mailing date May 4, 2004.

(Continued)

*Primary Examiner*—Thien F Tran
(74) *Attorney, Agent, or Firm*—Foley & Lardner LLP

(57) ABSTRACT

A multilayer substrate device formed from a base substrate and alternating metalization layers and dielectric layers. Each layer is formed without firing. Vias may extend through one of the dielectric layers such that two metalization layers surrounding the dielectric layers make contact with each other. The vias may be formed by placing pillars on top of a metalization layer, forming a dielectric layer on top of the metalization layer and surrounding the pillars, and removing the pillars. Dielectric layers may be followed by other dielectric layers and metalization layers may be followed by other metalization layers. Vias in the substrate may be filled by forming an assembly around the substrate, the assembly including printing sheets containing a conductive ink and pressure plates for applying pressure. A vacuum may be applied to remove air in the ink. Pressure may then be applied to the printing sheets through the pressure plates. The conductive ink in the printing sheets is pushed through the vias when pressure is applied by the pressure plates.

13 Claims, 8 Drawing Sheets

U.S. PATENT DOCUMENTS

| | | | |
|---|---|---|---|
| 4,543,953 | A | 10/1985 | Slocum et al. |
| 4,911,796 | A | 3/1990 | Reed |
| 4,922,323 | A | 5/1990 | Potter |
| 4,952,420 | A | 8/1990 | Walters |
| 4,976,991 | A | 12/1990 | Ammende et al. |
| 5,108,819 | A | 4/1992 | Heller et al. |
| 5,112,699 | A | 5/1992 | Chang |
| 5,165,407 | A | 11/1992 | Wilson et al. |
| 5,231,054 | A | 7/1993 | Kosugi |
| 5,241,456 | A | 8/1993 | Marcinkiewicz et al. |
| 5,299,571 | A | 4/1994 | Mastrototaro |
| 5,322,063 | A | 6/1994 | Allen et al. |
| 5,390,671 | A | 2/1995 | Lord et al. |
| 5,391,250 | A | 2/1995 | Cheney et al. |
| 5,411,647 | A | 5/1995 | Johnson et al. |
| 5,451,804 | A | 9/1995 | Lur et al. |
| 5,586,553 | A | 12/1996 | Halili et al. |
| 5,693,577 | A | 12/1997 | Krenik et al. |
| 5,777,060 | A | 7/1998 | Van Antwerp |
| 5,786,439 | A | 7/1998 | Van Antwerp et al. |
| 5,795,545 | A | 8/1998 | Koripella et al. |
| 5,841,584 | A | 11/1998 | Takatani et al. |
| 5,904,508 | A | 5/1999 | Codama et al. |
| 5,951,521 | A | 9/1999 | Mastrototaro et al. |
| 5,976,988 | A | 11/1999 | Konuma et al. |
| 6,032,064 | A | 2/2000 | Devlin et al. |
| 6,060,176 | A | 5/2000 | Semkow et al. |
| 6,081,182 | A | 6/2000 | Tomozawa et al. |
| 6,103,033 | A | 8/2000 | Say et al. |
| 6,162,611 | A | 12/2000 | Heller et al. |
| 6,174,804 | B1 | 1/2001 | Hsu |
| 6,184,477 | B1 | 2/2001 | Tanahashi |
| 6,197,688 | B1 | 3/2001 | Simpson |
| 6,256,206 | B1 | 7/2001 | Van Campenhout |
| 6,259,937 | B1 | 7/2001 | Schulman et al. |
| 6,262,376 | B1 | 7/2001 | Hurwitz et al. |
| 6,309,957 | B1 | 10/2001 | Tu et al. |
| 6,328,858 | B1 | 12/2001 | Felsenthal et al. |
| 6,360,888 | B1 | 3/2002 | McIvor et al. |
| 6,369,410 | B1 | 4/2002 | Yamazaki et al. |
| 6,458,234 | B1 | 10/2002 | Lake et al. |
| 6,458,686 | B1 | 10/2002 | Piao |
| 6,498,043 | B1 | 12/2002 | Schulman et al. |
| 6,564,079 | B1 | 5/2003 | Cory et al. |
| 7,271,400 | B1 | 9/2007 | Shaban et al. |
| 2001/0048164 | A1 | 12/2001 | Tateoka et al. |
| 2002/0106887 | A1 | 8/2002 | Chang |
| 2002/0122283 | A1 | 9/2002 | Higashi et al. |
| 2003/0007251 | A1 | 1/2003 | Imaizumi et al. |
| 2003/0016116 | A1 | 1/2003 | Blaha |
| 2003/0022030 | A1 | 1/2003 | Chang |
| 2003/0118797 | A1 | 6/2003 | Fluman et al. |
| 2004/0055893 | A1 | 3/2004 | Lubomirsky et al. |
| 2004/0061234 | A1 | 4/2004 | Shah et al. |
| 2005/0082636 | A1 | 4/2005 | Yashima et al. |
| 2005/0202667 | A1 | 9/2005 | Cohen et al. |

FOREIGN PATENT DOCUMENTS

| | | |
|---|---|---|
| EP | 0 329 973 B1 | 8/1989 |
| EP | 0 525 497 A1 | 2/1993 |
| EP | 0 529 752 A2 | 3/1993 |
| EP | 0 713 358 A2 | 5/1996 |
| EP | 1 096 838 A2 | 5/2001 |
| GB | 1102832 | 2/1968 |
| GB | 1348659 | 3/1974 |
| GB | 2 064 126 | 6/1981 |
| GB | 2064126 A | 6/1981 |
| JP | 55-4955 | 1/1980 |
| JP | 61-111598 | 5/1986 |
| JP | 3-120791 | 5/1991 |
| JP | 04-015985 | 1/1992 |
| JP | 06-013723 | 1/1994 |
| JP | 6-13723 | 1/1994 |
| JP | 06-132662 | 5/1994 |
| JP | 8-31932 | 2/1996 |
| JP | 08-031932 | 2/1996 |
| JP | 10-115711 | 5/1998 |
| JP | 2001074681 A | 3/2001 |
| JP | 2001-257469 | 9/2001 |
| JP | 2002-221801 | 8/2002 |
| JP | 2003-115663 | 4/2003 |
| JP | 2006-513558 | 4/2006 |
| WO | WO/89 02697 | 3/1989 |
| WO | WO-98/56293 | 12/1998 |
| WO | WO-99/45375 | 9/1999 |
| WO | WO-99/45387 | 9/1999 |
| WO | WO-99/56613 A | 11/1999 |
| WO | WO 03/023388 A1 | 3/2003 |
| WO | WO-03/100846 | 12/2003 |

OTHER PUBLICATIONS

PCT International Search Report as issued in International Application No. PCT/US2006/009203 Mailing date Jul. 6, 2006.

PCT International Search Report as issued in International Application No. PCT/US2004/028600 Mailing date Mar. 16, 2005.

EP Search Report as issued in European Application No. 03754668.6 2214, Mailing date Oct. 24, 2005.

Young W. Kim and Mark G. Allen—Oct. 1, 1992 School of Electrical Engineering, Georgia Institute of Technology, Atlanta GA 30332-0250—*Single—and multi-layer surface-micromachined platforms using electroplated sacrificial layers.* pp. 61-68; vol. A35.

Dr. J. Prymak; Dr. S. Bhattacharya & Prof. K. Paik-*Fundamentals of Passives: Discrete Integrated, and Embedded (CH. 11)*-Fundamentals of Microsystems Packaging, 2000.

T. Remmel; P. Zurcher; M. Kim; M. Miller; M. Raymond; S. Straub; M. Tarabbia; R. Steimle & P. Chu-*Integration of Thin-Film Capacitors and Resistors into ULSI Technology for Wireless Applications*-Passive Component Industry, Jan./Feb. 2001.

CH 6—Thermal Transducers-Micromachined Transducers Soucebook. pp. 549-610.

J.J. Licari-*Thin and Thick Films (CH 8)*-.

Non-Final Office Action dated Apr. 22, 2009 from related U.S. Appl. No. 11/395,457.

Decision of Rejection dated Apr. 7, 2009 for related Japanese patent application No. 2006-528019.

Office Action dated Apr. 14, 2009 from related Japanese patent application No. 2004-540098.

Office Action dated Jun. 29, 2009 issued in related U.S. Appl. No. 11/086,936.

Office Action issued on Jul. 15, 2008 from related Japanese patent application 2006-528019.

3M Specifications and Design Guidelines, Microflex circuits for IC Interconnect Solutions, 1D pp. 1-32 (the entire document), 1997 (3M Electronic Products Division, Austin, TX).

Micron Wide Conductors and Spaces on 26 PZT, Alumina, Glass and Flexible Materials 1D 1 page, no date (Metrigraphics, Wilmington, MA).

3M Offers More Solutions for the Semiconductor Industry 1D the entire document, 1997 (3M Electronic Products Division, Austin TX).

Examiner's Report dated Mar. 11, 2010 from related Canadian patent application No. 2539280.

Foreign Office Action dated Mar. 16, 2010 from related Japanese application No. 2004-540098.

Search Report dated May 4, 2004 from related PCT International application No. PCT/US03/29224.

Final Office Action for U.S. Appl. No. 11/086,936 dated Jan. 20, 2010.

Final Office Action received for U.S. Appl. No. 09/779,282 dated Feb. 11, 2004.

Final Office Action received for U.S. Appl. No. 10/331,186 dated Feb. 8, 2007.

Final Office Action received for U.S. Appl. No. 10/331,186 dated Nov. 16, 2005.
Final Office Action received for U.S. Appl. No. 11/030,235 dated Aug. 22, 2007.
Final Office Action received for U.S. Appl. No. 11/030,235 dated Jul. 1, 2008.
Final Office Action received for U.S. Appl. No. 11/030,235 dated Nov. 10, 2005.
Final Office Action received for U.S. Appl. No. 11/030,235 dated Nov. 6, 2006.
Final Office Action received for U.S. Appl. No. 11/086,936 dated Aug. 8, 2007.
Final Office Action received for U.S. Appl. No. 11/086,936 dated May 15, 2008.
Final Office Action received for U.S. Appl. No. 11/395,457 dated Nov. 17, 2008.
Flexible Circuits at Extreme Density 1D, 8 unnumbered pages of various dates (Metrigraphics, Wilmington, MA).
Koudelka, M. et al., 1CIn-vivo Behaviour of Hypodermically Implanted Microfabricated Glucose Sensors 1D, Biosensors & Bioelectronics 6 (Elsevier Science Publishers Ltd., England 13 1991), pp. 31-36.
Koudelka, M. et al., 1CPlanar Amperometric Enzyme-Based Glucose Microelectrode 1D Sensors and Actuators, 18 (Elsevier Sequoia, The Netherlands 13 1989), pp. 157-165.
Mastrototaro, John M. et al., 1CAn electroenzymatic glucose sensor fabricated on a flexible substrate 1D, Sensors and Actuators B. 5 (Elsevier Sequoia 13 1991), pp. 139-144.
Metrigraphics Ion Bean Etching Capability, 1 page, no date (Metrigraphics, Wilimington MA).
Microflex Solutions from 3M 1D the entire document, 1996 (3M Electronic Products Division, Austin TX).
Non-final Office Action received for U.S. Appl. No. 09/779,282 dated Jan. 13, 2005. (INV-46552/USX).
Non-final Office Action received for U.S. Appl. No. 09/779,282 dated Jun. 23, 2003.
Non-final Office Action received for U.S. Appl. No. 10/331,186 dated Jul. 11, 2006.
Non-final Office Action received for U.S. Appl. No. 10/331,186 dated Jul. 26, 2004.
Non-final Office Action received for U.S. Appl. No. 10/671,996 dated Aug. 22, 2005.
Non-final Office Action received for U.S. Appl. No. 10/845,002 dated Apr. 14, 2006.
Non-final Office Action received for U.S. Appl. No. 10/845,002 dated Jan. 8, 2007.
Non-final Office Action received for U.S. Appl. No. 10/845,002 dated Jul. 27, 2005.
Non-final Office Action received for U.S. Appl. No. 11/030,235 dated Apr. 11, 2007.
Non-final Office Action received for U.S. Appl. No. 11/030,235 dated Jan. 9, 2008.
Non-final Office Action received for U.S. Appl. No. 11/030,235 dated Jul. 10, 2006.
Non-final Office Action received for U.S. Appl. No. 11/030,235 dated Jun. 24, 2005.
Non-final Office Action received for U.S. Appl. No. 11/086,936 dated Feb. 8, 2007.
Non-final Office Action received for U.S. Appl. No. 11/086,936 dated Nov. 29, 2007.
Non-final Office Action received for U.S. Appl. No. 11/086,936 dated Sep. 30, 2009.
Non-final Office Action received for U.S. Appl. No. 11/395,457 dated Mar. 31, 2008.
Non-final Office Action received for U.S. Appl. No. 11/395,457 dated Oct. 12, 2007.
Notice of Allowance (1st) received for U.S. Appl. No. 10/671,996 dated Apr. 21, 2006.
Notice of Allowance (2nd) received for U.S. Appl. No. 10/671,996 dated Aug. 25, 2006.
Notice of Allowance received for U.S. Appl. No. 09/779,282 dated Nov. 15, 2005. (INV-46552/USX).
Notice of Allowance received for U.S. Appl. No. 10/845,002 dated Jul. 9, 2007.
Notice of Allowance received for U.S. Appl. No. 11/030,235 dated Jan. 22, 2009.
Notice of Allowance received for U.S. Appl. No. 11/395,457 dated Nov. 13, 2009.
Office Action received for Canadian Appln. No. 2,539,280 dated Nov. 19, 2009.
Office Action received for EP 03754668.6 dated Feb. 2, 2006.
Office Action received for EP 04782987.4 dated Sep. 18, 2007.
Supplementary Search Report received for EP 3754668.6 dated Oct. 17, 2005.
Translation of Decision of Rejection received for JP 2006-528019 sent Apr. 28, 2009.
Urban, G. et al., 1CMiniaturized multi-enzyme biosensors integrated with ph sensors on flexible polymer carriers for in vivo applications 1D, Biosensors & Bioelectronics 7 (Elsevier Science Publishers Ltd. 13 1992, pp. 733-739.

* cited by examiner

MULTILAYER SUBSTRATE

CROSS-REFERENCE TO RELATED APPLICATIONS

This application is a continuation application of U.S. application Ser. No. 10/845,002, filed May 12, 2004 now U.S. Pat. No. 7,297,627, entitled "Multilayer Substrate", which claims priority from now abandoned U.S. application Ser. No. 10/331,186, filed Dec. 26, 2002 entitled "Multilayer Substrate", which claims priority from U.S. Provisional Application Ser. No. 60/414,289, filed Sep. 27, 2002, entitled "Multilayer Substrate," the contents of each above referenced application are incorporated by reference herein and is a basis for a claim of priority.

BACKGROUND

1. Field of the Invention

The present invention relates to the field of semiconductor fabrication technology and, in particular, to the formation of substrates having multiple layers, i.e., the formation of multilayer substrates.

2. Description of Related Art

Multilayer substrates are becoming increasingly popular in the microelectronics arena for a variety of reasons. The high packing densities, accommodation of varied types of circuit elements and facilitation of complex circuitries afforded by multilayer substrates have generated an increased interest and use in these devices. As the requirements for increased packing densities, complex circuit functionality and other requirements necessitated by current market conditions proliferate, so too will the demand for multilayer substrates that enable such requirements.

A number of techniques currently exist for multilayer substrate fabrication. One method of fabricating multilayer substrates is to laminate single, unfired semiconductor tapes, commonly referred to in the industry as "green sheets" or "green tape." In a typical, conventional layered green sheet process, a multilayer substrate may be produced by a) printing a circuit pattern on a glass or ceramic green sheet; b) laminating several green sheets that have been printed; and c) firing or sintering the laminated green sheets in a reducing atmosphere. The resulting product is a laminated, multilayer substrate that may be used in a variety of applications.

Multilayer substrates formed from green sheets have a number of disadvantages. Although any number of green sheet layers may be laminated together, the overall height of the multilayer substrate is determined by the thickness of each individual green sheet used in the multilayer structure. Green sheet thickness is determined by the green sheet manufacturer, and, typically, the thickness of an individual green sheet is in the area of 6 mils to 30 mils. Most conventional multilayer substrate fabrication techniques cannot accommodate green sheets of less than 6 mil thickness because green sheets of these thicknesses tend to be too thin to be successfully fabricated into a multilayer substrate. Thus, where a multilayer substrate having thin layers is desired, green sheets are generally not feasible as an option.

Also, because the end user has no control over the thickness of each individual green sheet, the end user is forced to limit the number of layers of the multilayer substrate according to the maximum height allowable for the intended application of the multilayer substrate device. For applications requiring minimum substrate height, the number of green sheets available for lamination may be limited due to their predetermined thickness, thus limiting the complexity of the design. Accordingly, for small footprint devices that require complex designs, laminated green sheets may prove inadequate.

Another disadvantage of using laminated green sheets for multilayer substrate fabrication is that the green sheets must be sintered, or fired during the fabrication process. As is the case with many physical processes requiring the introduction of heat, firing the laminated green sheet, i.e., heating the green sheet, causes shrinkage in the various elements of the substrate, including the circuit traces printed on each laminate. Thus, the tolerances, dimensions and other parameters of the traces and other elements of the substrate are subject to variance. Moreover, the exact amount of shrinkage during firing may be difficult to control. For designs in which geometries are critical, requiring minimum variance in trace tolerances and high accuracy in trace dimensions or other substrate parameters, laminated green sheets may prove wholly inadequate. If a multilayer substrate is fabricated using green sheets in which each of the individual green sheets have thicknesses of varying heights, a technique which is common in the semiconductor industry, the effects of firing and shrinkage are even more pronounced and dramatic.

Another disadvantage of using laminated green sheets for multilayer substrate fabrication is that the dielectric used to form the green sheets is generally not of as high a quality as is required for some applications. Because multilayer substrates fabricated with green sheets are subjected to elevated temperatures during processing, the dielectrics used in green sheets must be able to tolerate elevated temperatures without compromise to the integrity of the dielectric. Accordingly, impure dielectrics, which typically show enhanced reliability at elevated temperatures, are used as the dielectric in green sheets. These impure dielectrics can be limiting when forming circuit elements, such as high voltage capacitors for example. Thus, in applications where pure dielectrics are required, the temperature processing required for multilayer substrates fabricated using green sheets generally precludes green sheets as an option for forming such substrates.

Another method of fabricating multilayer substrates is to use thick film processes. The thick film process is a sequential process requiring a) printing a circuit pattern on a substrate; b) drying the substrate; and c) firing the substrate. This process is repeated as many times as is necessary or desired in order to obtain the number of layers required. Each individual substrate is printed, dried and fired, then adhered to the other substrates which have been printed, dried and fired to form a substrate stack. In this way, a multilayer substrate is formed from individually prepared substrates.

However, multilayer substrates formed from thick film processes suffer from many of the same disadvantages as green sheet multilayer substrates. The thickness of a multilayer substrate formed using thick film processes is dictated by the thickness of each individual substrate. As is the case with green sheets, the ultimate height of the substrate is determined by the cumulative height of the substrates rather than the requirements of the application. Excessive cumulative substrate height may be an unacceptable design restriction and, thus, thick film processes may be inadequate for forming multilayer substrates in the intended application.

Because thick film processes require firing each substrate layer, multilayer substrates formed using thick film processes also suffer from shrinkage issues. Like green sheets, designs requiring minimum variance in substrate parameter tolerances and high accuracy in substrate parameter dimensions may not be adequately served by thick film multilayer substrate formation processes.

The filling of vias in the substrate is a normal part of the substrate fabrication process. Traditional via filling is usually accomplished using thick film printing techniques, where squeegee printing processes push conductive ink into the vias, or with vacuum techniques that effectively pull conductive ink through the vias.

When conductive ink is pulled through a via, much of the ink is lost due to waste. For small production runs, such waste may be of little concern. However, for large production runs, the cost attributed to wasted ink could ultimately exceed the cost of the substrate itself. Thus, for large production runs, filling substrate vias using vacuum techniques becomes cost prohibitive.

Although there is less waste in thick film techniques, traditional squeegee via filling techniques typically allow air to be trapped in the conductive ink, causing air voids to form within the interior of the via. Air voids are deleterious to the conductive path through the via, plaguing the via with a variety of performance detractors. Air voids can greatly reduce the electrical conductance through the path, increasing via resistance and generating excess heat in the via. To complicate matters, air voids can greatly reduce the thermal conductance through the path, providing even less of a mechanism by which to remove the excess heat resulting from the decrease in electrical conductance.

Of equal if not greater concern for practitioners involved with devices that are implanted into a human or animal body, air voids compromise the hermeticity of the conductive path through the via. Often, the conductive path through the via is the single path bodily fluids may take to reach sensitive microelectronics that could be damaged or destroyed by exposure to such fluids. If an implantable device is formed having vias that require hermetic sealing, any air voids within the via that compromise the hermeticity of the path and allow fluids to pass through the via could result in device malfunction or even device failure, which could have disastrous consequences for the user of the device.

Accordingly, there is a need in the semiconductor industry for multilayer substrates having layers which may vary widely in thickness and which may be accurately controlled. There is also a need in the semiconductor industry for multilayer substrates in which circuit element and trace tolerance is tightly controlled and line dimension shrinkage is minimized. There is yet another need in the semiconductor industry for multilayer substrates in which high purity dielectrics may be used.

In addition, there is a need in the semiconductor industry for methods and systems for filling vias in a substrate that do not waste conductive ink. There is yet another need in the semiconductor industry for methods and systems for filling vias in a substrate that eliminate air voids in the conductive path through the via.

SUMMARY

Accordingly, it is an object of embodiments of the present invention to provide a multilayer substrate and a method of fabricating a multilayer substrate in which the multilayer substrate may be fabricated without firing. It is also an object of embodiments of the present invention to provide a multilayer substrate and a method of fabricating a multilayer substrate in which the thickness of each layer in the substrate may be widely varied and accurately controlled by the user. It is also an object of embodiments of the present invention to provide a multilayer substrate and a method of fabricating a multilayer substrate in which circuit element and trace tolerance is tightly controlled and dimension shrinkage is kept to a minimum or eliminated altogether. It is also an object of embodiments of the present invention to provide a multilayer substrate fabricated using a process in which dielectrics of high purity may be incorporated into the substrate.

Embodiments of the present invention may use of variety of materials as multilayer substrate dielectrics. For example, and without limitation, alumina having a purity of 99.999% may be used as a dielectric in embodiments of the present invention.

According to an embodiment of the present invention, a multilayer substrate device includes a base substrate and a first metalization layer formed on the base substrate, wherein the multilayer substrate is formed without firing. The multilayer substrate may also include a plurality of alternating dielectric layers and metalization layers formed over the first metalization layer. One of the plurality of the dielectric layers may be alumina.

The multilayer substrate may also include vias extending through one of the plurality of dielectric layers such that two of the metalization layers surrounding the one of the plurality of dielectric layers make contact with each other through the via. Also, two of the plurality of metalization layers and one of the plurality of the dielectric layers may form a capacitor.

The base substrate of the multilayer substrate may be formed from a variety of materials, such as, for example, glass or ceramic.

According to an embodiment of the present invention, a method for forming a multilayer substrate includes obtaining a base substrate and forming a first metalization layer on the base substrate without firing. The method may further include forming a plurality of alternating dielectric layers and metalization layers over the first metalization layer. Any layer of the plurality of dielectric layers may be formed by a variety of techniques, including, without limitation, ion beam assist deposition, sputtering, chemical vapor deposition, epitaxial deposition or evaporation.

A method of forming a plurality of dielectric layers in the multilayer substrate may include forming an opening in a mask; affixing the mask to a layer of the substrate; depositing an active material in the openings; removing the mask after the active material has been deposited; forming a dielectric around the active material; and removing the active material after the dielectric has been formed around the active material. When forming the plurality of dielectric layers in the multilayer substrate, a height of the dielectric layer is less than a height of the active material. For example, the height of the dielectric layer may be one-third or one-half the height of the active material.

When forming the active material on the multilayer substrate, pillars may be formed on one of the plurality of metalization layers out of the active material. The active material may be removed using a dissolving solution, such as, for example, ferric chloride. After the active material is removed, vias may be formed through one of the plurality of dielectric layers.

It is also an object of the present invention to provide a cost-efficient method and apparatus for filling vias in a substrate that reduces or eliminates wasted conductive ink. It is a further embodiment of the present invention to provide a method and apparatus for providing conductive paths through vias in a substrate that are devoid of air, such that the path through the via may be hermetic.

According to an embodiment of the present invention, an assembly for fabricating substrates includes first and second pressure plates for applying pressure, first and second assembly plates, and first and second printing sheets for printing on a substrate. The first assembly plate may be located adjacent the first pressure plate and the second assembly plate may be located adjacent the second pressure plate. The first printing sheet may be located adjacent the first assembly plate and the second printing sheet may be located adjacent the second assembly plate. The assembly may also include an enclosure surrounding the first and second assembly plates, the first and second printing sheets, and the substrate.

According to an embodiment of the present invention, the first pressure plate and the first printing sheet surround the first assembly plate and the second pressure plate and the second printing sheet surround the second assembly plate. Also, the first pressure plate, the first assembly plate and the first printing sheet are located adjacent a first side of the substrate and the second pressure plate, the second assembly plate and the second printing sheet are located adjacent a second side of the substrate. A pressure applied by the first pressure plate and the second pressure plate acts through the first assembly plate and the second assembly plate to force ink in the first printing sheet and the second printing sheet through vias in the substrate The enclosure may include a port for pulling a vacuum in the enclosure and, thus, a vacuum may surround the assembly and the substrate. Also, the first and second printing sheets may be made from foam rubber.

According to an embodiment of the present invention, a method for filling vias in a substrate may include forming an assembly around the substrate, the assembly including printing sheets for containing a conductive ink and further including pressure plates for applying pressure; applying a vacuum about the assembly; and applying pressure to the printing sheets. When pressure is applied by the pressure plates the conductive ink in the printing sheets is pushed through the vias. The method may also include printing a pattern on the substrate; drying the substrate; and firing the substrate.

When forming the assembly around the substrate, the method may include positioning a first printing sheet adjacent a first side of the substrate; positioning a first assembly plate adjacent the first printing sheet; positioning a first pressure plate adjacent the first assembly plate; positioning a second printing sheet adjacent a second side of the substrate; positioning a second assembly plate adjacent the second printing sheet; positioning a second pressure plate adjacent the second assembly plate; and positioning an enclosure around at least the substrate and the first and second printing sheets.

Applying a vacuum about the assembly may include pulling a vacuum in the enclosure. When pulling a vacuum in the enclosure, air is removed from the conductive ink when a vacuum is pulled in the enclosure. Also, applying a pressure to the printing sheets may include applying a low pressure or a high pressure. The high pressure may be about 1000 lbs.

DETAILED DESCRIPTION

In the following description of preferred embodiments, reference is made to the accompanying drawings which form a part hereof, and in which are shown by way of illustration specific embodiments in which the invention may be practiced. It is to be understood that other embodiments may be utilized and structural changes may be made without departing from the scope of the preferred embodiments of the present invention.

Figure 1:
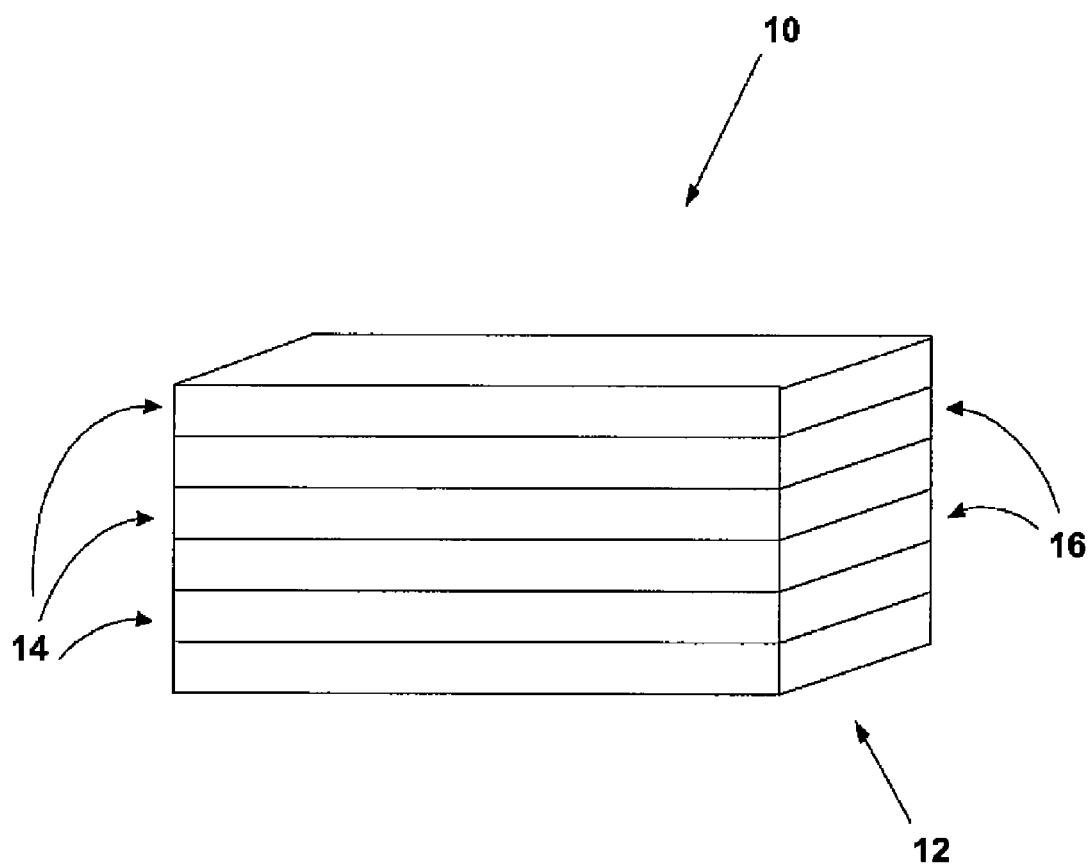
FIG. 1 shows a perspective view of a multilayer substrate according to an embodiment of the present invention.

A multilayer substrate 10 according to an embodiment of the present invention is shown generally in FIG. 1. The multilayer substrate 10 may contain a plurality of alternating dielectric layers and conductive layers. As shown in FIG. 1, the multilayer substrate 10 starts with a base substrate 12, on top of which is a metalization, or conductive, layer 14. The multilayer substrate 10 of FIG. 1 includes two other metalization layers 14. Sandwiched in between the metalization layers 14 are dielectric layers 16.

The base substrate layer 12 may be rigid or flexible and may be made from any type of substrate material commonly used in the art, such as, for example, ceramic, glass, silicon, gallium arsenide, alumina and the like. The metalization layer 14 may also be formed from a variety of materials, such as, for example, copper, aluminum, silver, gold, titanium, platinum and the like. The dielectric layer 16 may be of a variety of materials commonly used in the art, such as, for example, ceramic, silicon, alumina and the like. Dielectrics of high purity may be used for the dielectric layer 16, such as, for example, 99.999% alumina.

Although the multilayer substrate 10 shown in FIG. 1 may appear to have an extended height, the height of each layer shown in FIG. 1 is exaggerated for illustration purposes only. In fact, the height of each layer shown in the multilayer substrate 10 of FIG. 1 may vary widely at the discretion of the fabricator.

Moreover, although the multilayer substrate 10 of FIG. 1 is shown to be a rectangular cylinder, it need not be. Indeed, the shape of the multilayer substrate 10 may take on any shape desired by the fabricator. The multilayer substrate 10 may be a rectangular cylinder, a right circular cylinder or any other shape necessitated by the requirements of a particular application.

Also, while the multilayer substrate of FIG. 1 shows alternating metalization layers and dielectric layers, the layers need not alternate. For example, one dielectric layer may be followed by another dielectric layer if desired. Moreover, one metalization layer may be followed by another metalization layer. Thus, according to an embodiment of the present invention, a plurality of dielectric layers may be followed by a plurality of metalization layers and vice versa.

Figure 2:
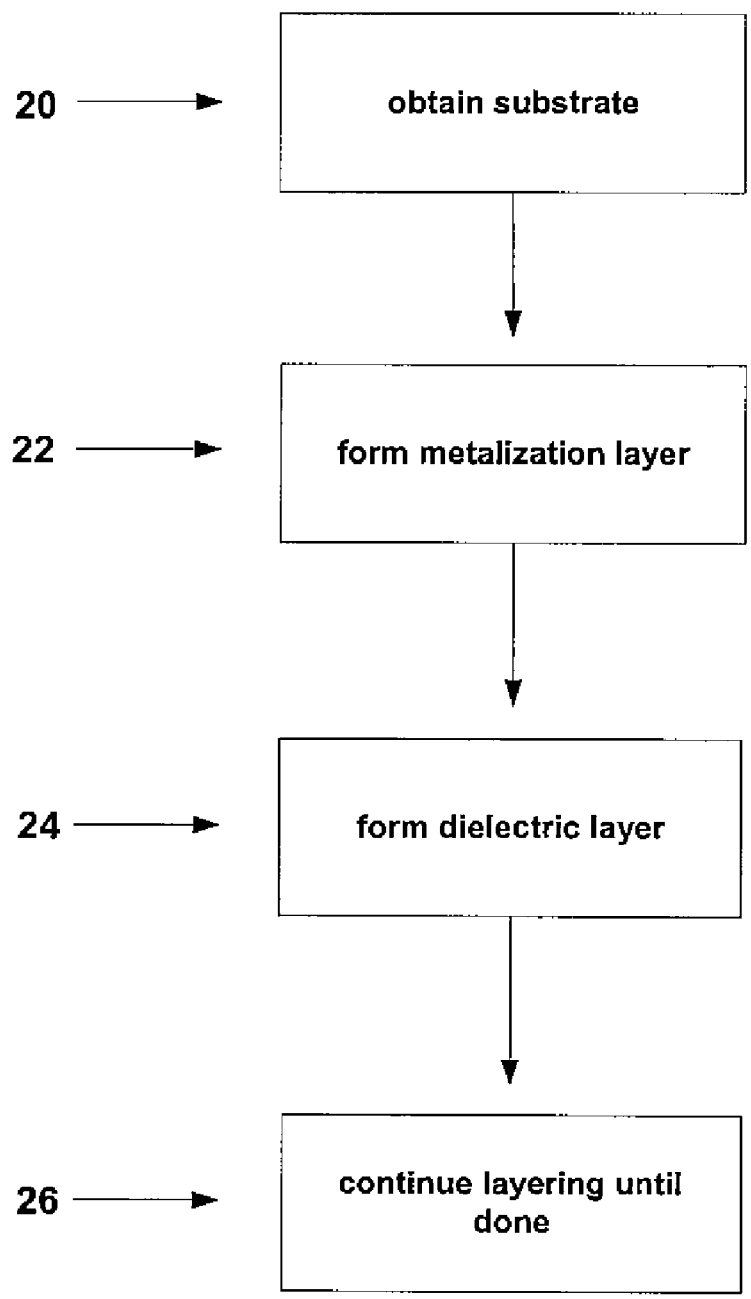
FIG. 2 shows a generalized method for fabricating a multilayer substrate according to an embodiment of the present invention.

A generalized method for fabricating a multilayer substrate according to embodiments of the present invention is shown in FIG. 2. At step 20, a base substrate is obtained. The substrate may be made from any type of substrate material commonly used in the art, such as, for example, ceramic, glass, silicon, gallium arsenide, alumina and the like. A metalization layer may then be formed on top of the base substrate at step 22. At step 24, a dielectric layer may be formed on top of the metalization layer. Alternate layering of metalization layers and dielectric layers may continue until the desired substrate is fabricated as shown at step 26.

Figure 3A:
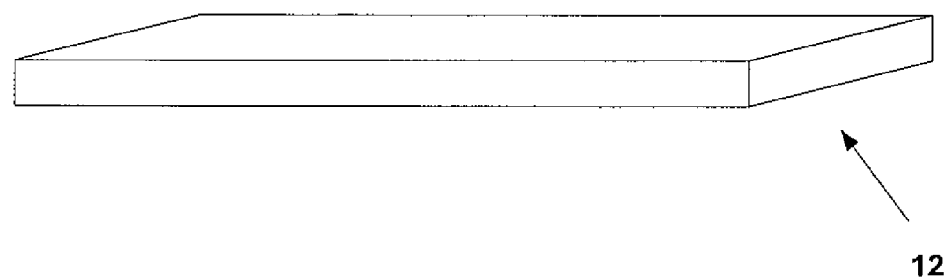
FIG. 3A shows a perspective view of a base substrate according to an embodiment of the present invention.
Figure 4A:
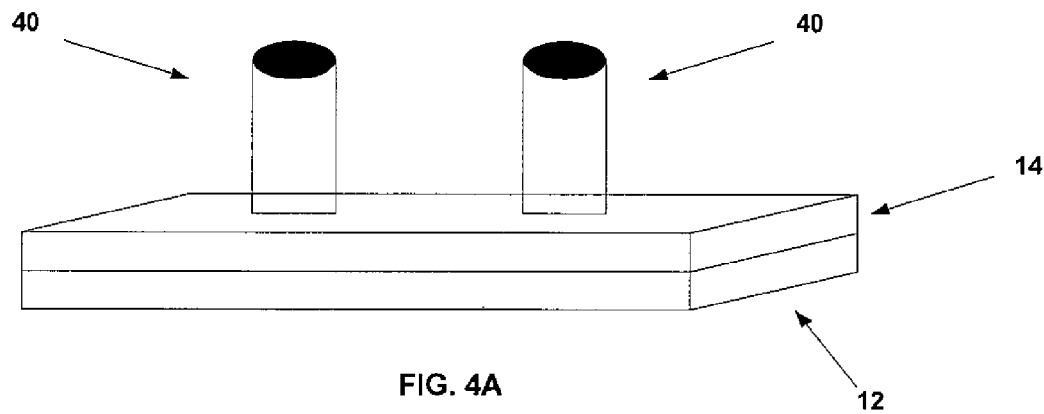
FIG. 4A shows a perspective view of two aluminum pillars formed and located on top of a metalization layer according to an embodiment of the present invention.
Figure 4B:
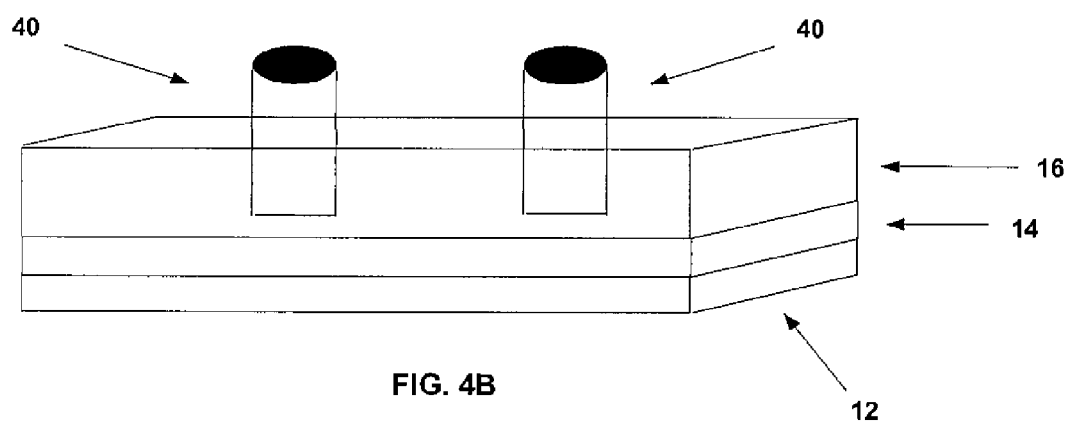
FIG. 4B, shows a perspective view of a dielectric layer formed on top of a metalization layer and covering a portion of aluminum pillars according to an embodiment of the present invention.
Figure 4C:
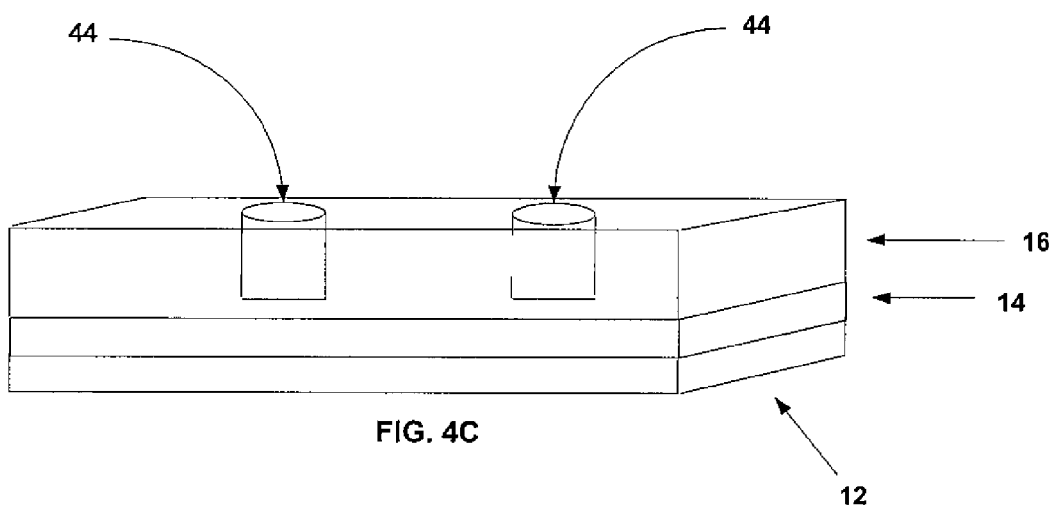
FIG. 4C shows a perspective view of a dielectric layer formed on top of a metalization layer in which the aluminum pillars have been removed according to an embodiment of the present invention.
Figure 5:
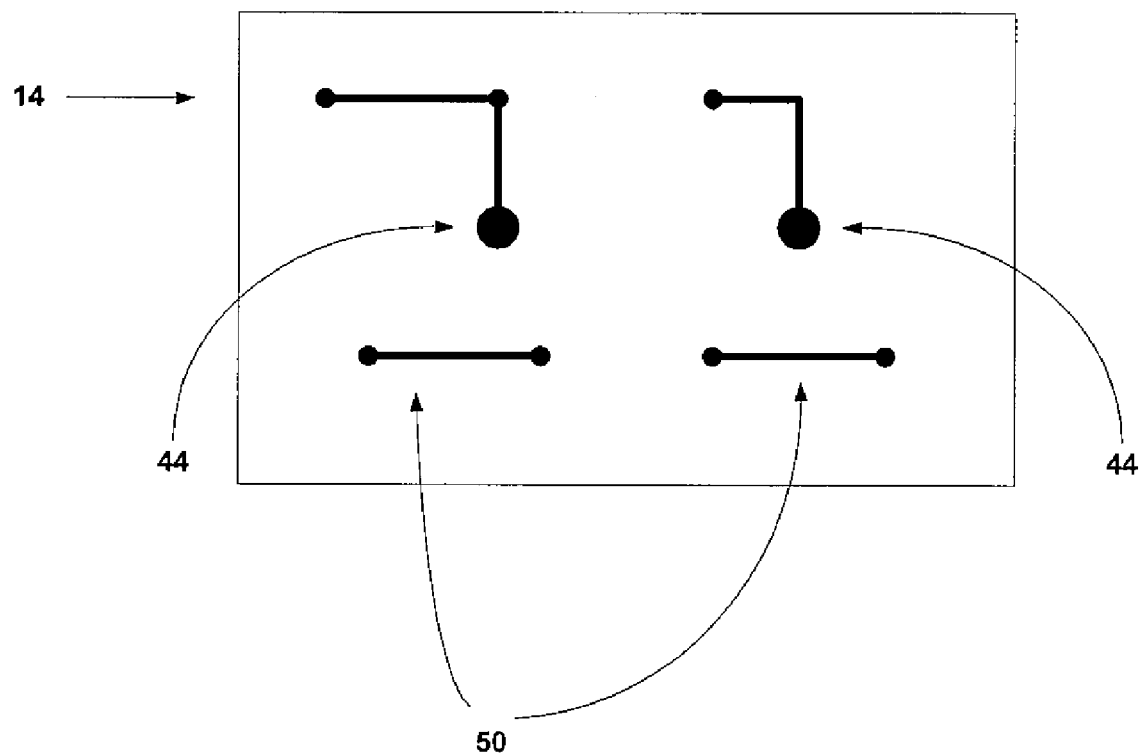
FIG. 5 shows a perspective view of a metalization layer deposited onto a dielectric layer according to an embodiment of the present invention.

A multilayer substrate fabricated according to the method shown in FIG. 2 may be seen in FIGS. 3-5. A base substrate 12 is shown in FIG. 3A. The base substrate 12 may be of a garden variety type or may be fabricated for specialized applications. For example, a substrate used for in vivo glucose monitoring applications, which is fabricated with electronics on one side of the substrate and electrodes on another side of the substrate, and having vias extending through the substrate such that an hermetic path between the electronic side of the substrate and the electrode side of the substrate exists, may be used as a base substrate 12 for the multilayer substrate. A substrate of this type is disclosed in a U.S. patent application/entitled "Sensor Substrate and Method of Fabricating Same," Ser. No. 10/038,276, filed Dec. 31, 2001, the contents of which are incorporated by reference herein. Other substrates suitable for use in the biomedical, computer, telecommunications, defense, aerospace and other industries may also be used.

Figure 3B:
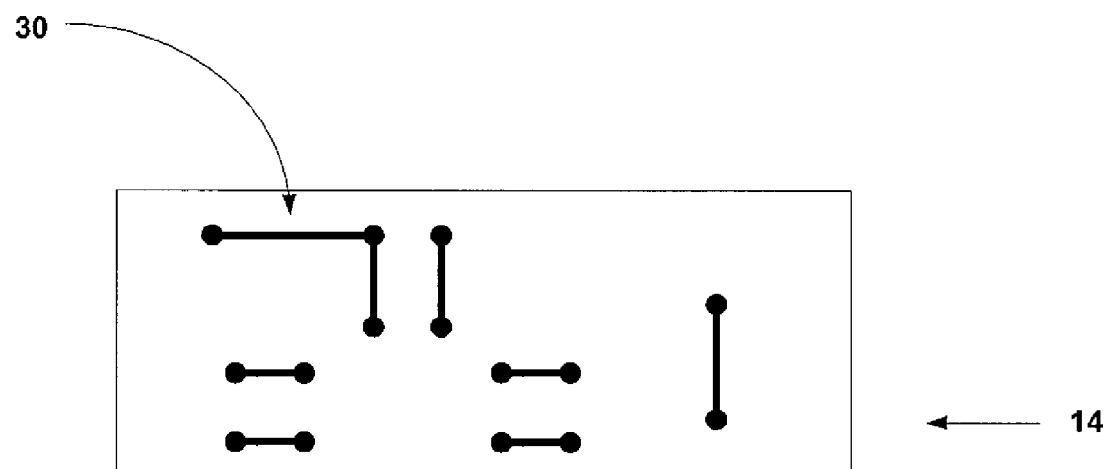
FIG. 3B shows a plan view of a metalization layer having a metal pattern formed on top of a base substrate according to an embodiment of the present invention.

A metalization layer 14 having a metal pattern 30 may be formed on top of the base substrate 12 as shown in FIG. 3B. The metalization layer 14 and metal pattern 30 may be formed with standard resist and photolithography techniques or may be formed using other techniques that are common in the art. As stated previously, the metal pattern 30 may be formed from copper, aluminum, silver, gold, titanium, platinum and the like. In practice, this layer may actually be two, three, or more layers. For example, the metalization layer 14 may be a titanium-platinum layer. Alternatively, the metalization layer 14 may be a titanium-platinum-titanium layer. According to another embodiment of the present invention, the metalization layer 14 may be fabricated from alternating layers of copper and aluminum. The pattern may correspond to the pins of an integrated circuit or may be some other pattern depending on the desired application.

Layering and formation of the dielectric layer may be seen in FIGS. 4A-4C. Although some applications may not require that metalization layers be electrically connected, such as, for example, in the fabrication of a capacitor formed from a dielectric layer sandwiched in between two metalization layers, other applications may require that the metalization layers make electrical contact with each other. FIG. 4A shows two aluminum pillars 40 formed and located on top of the metalization layer 14 as part of the process to effect electrical contact between the metalization layer 14 and subsequent metalization layers. The aluminum pillars 40 may be used to form vias extending through the dielectric layer 16. Although FIG. 4A shows two aluminum pillars 40, as many aluminum pillars as are desired may be deposited on top of the metalization layer 14 to ultimately create as many vias extending through the dielectric layer 16 as are needed. In FIG. 4B, the dielectric layer 16 is formed on top of the metalization layer 14 covering a portion of the aluminum pillars 40. The aluminum pillars 40 and the dielectric layer 16 may be sized such that the height of the aluminum pillars 40 always extends to a height greater than the height of the dielectric layer 16.

In FIG. 4C, the aluminum pillars 40 have been removed. The aluminum pillars 40 may be removed with a solvent to which the aluminum pillars 40 are susceptible but to which the dielectric layer 16 is impervious. For example, the aluminum pillars 40 may be dissolved with ferric chloride. Once the aluminum pillars 40 have been removed, vias 44 remain and extend from the top of the dielectric layer 16 to the bottom of the dielectric layer 16, allowing the portion of the metalization layer 14 over which the aluminum pillars 40 were formed to be exposed.

Subsequently, another metalization layer 14 may be deposited onto the dielectric layer 16 as shown in FIG. 5. This metalization layer 14 may also include a metalized pattern 50. In addition, when the metalized pattern 50 is formed, the vias 44 that were formed when the aluminum pillars 40 were dissolved may be filled with the metal used for the pattern, thus creating a conductive path from one metalization to another. The process of alternating metalization layers and dielectric layers may continue for as many layers as is desired by the fabricator or is necessitated by the application.

Figure 6:
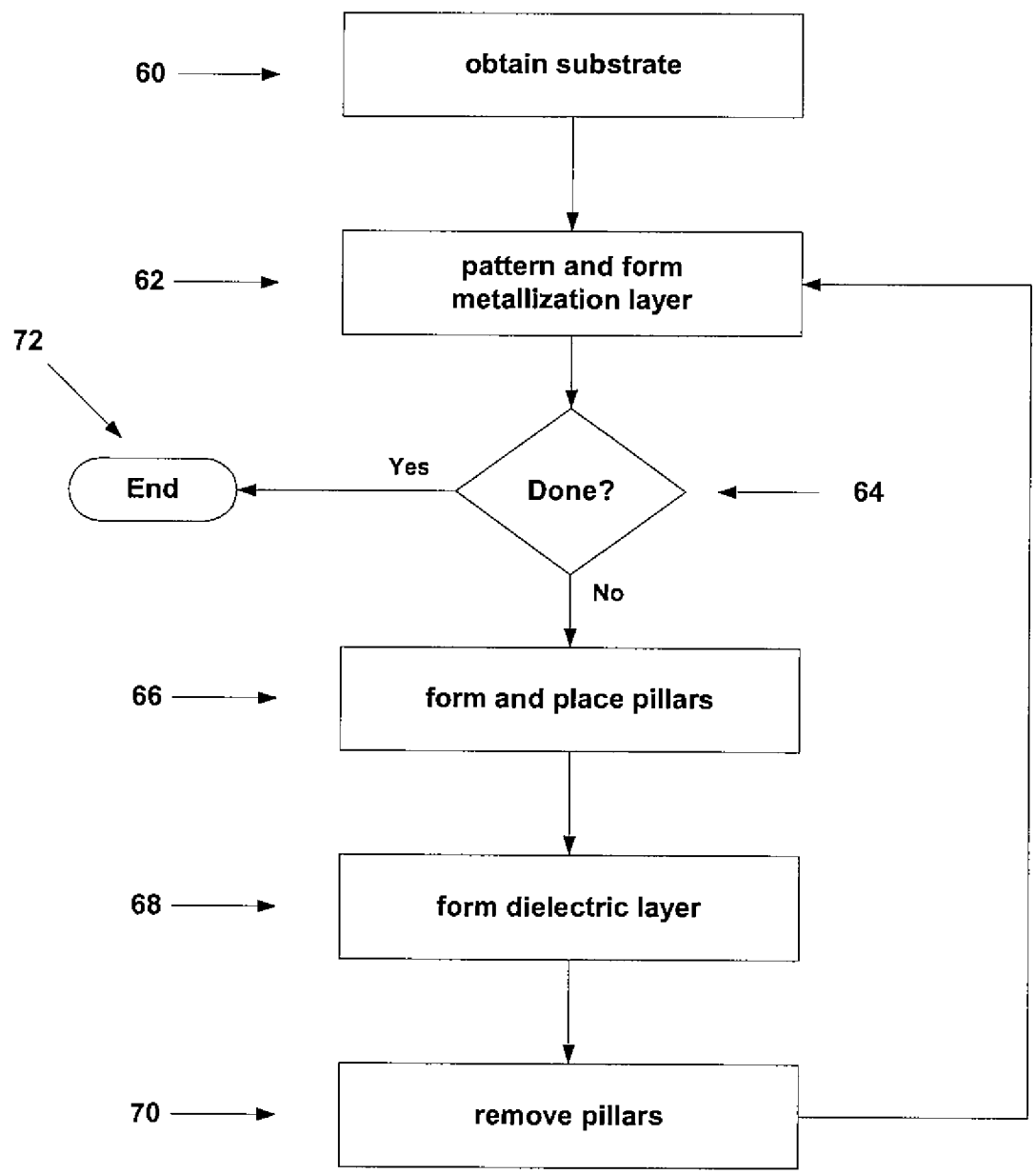
FIG. 6 shows a detailed method for fabricating a multilayer substrate according to an embodiment of the present invention.

A more detailed method for forming multilayer substrates according to embodiments of the present invention is shown in FIG. 6. A substrate is obtained at step 60. The substrate may be made from any type of substrate material commonly used in the art, such as, for example, ceramic, glass, silicon, gallium arsenide, alumina and the like. At step 62, a metalization layer is patterned and formed on top of the substrate. In practice, the metalization layer may actually be on or more metalization layers. At step 64, if the substrate having a single metalization layer is all that is necessitated by the application, the process will end at step 72. Although a substrate with a single metalization layer or dielectric layer may be formed according to embodiments of the present invention, if more than one layer is desired after the first metalization layer is patterned and formed at step 62, pillars may be formed and placed at step 66. The pillars may be placed onto any point of contact desired on the metalization layer patterned and deposited at step 62.

The pillars may be formed by first laser drilling, punching or otherwise working a ceramic or other material mask, or shadow mask, to form openings corresponding to the placement of the pillars on the substrate. In addition, the mask may contain other features such as, for example, pads for bonding, stimulating electrodes, sensing electrodes, optical detectors, vias and the like for making contact between layers and the like. Moreover, the features of the mask may take on a variety of dimensions. For example, some features may be 1 or 2 mils in height. Other features may be at the micron or angstrom level. As another example, some embodiments may form openings for the pillars that are 20-25 microns deep.

Once the mask has been formed, it may then be affixed to the substrate on top of the metalization layer applied during step 62. Aluminum or another material is then deposited through the openings of the mask to form a pattern on top of the metalization layer. After depositing the aluminum, the mask is removed, leaving a positive image in aluminum of the pattern contained in the mask.

Once the pillars and/or other features have been formed, a dielectric layer may be formed at step 68, also on top of the metalization layer. Generally, the height of the dielectric layer will not extend past the height of the pillars and/or other features. The height of the dielectric layer may vary, but, as a first approximation, the dielectric layer may be one-half to one-third the height of the pillars and/or other features formed using the mask from the aluminum or other material. The deposited dielectric will, thus, be prevented from completely encapsulating the side walls of the aluminum pattern.

Formation of the dielectric may be effected in a variety of ways. For example, the entire substrate may be put into a vacuum chamber and blanket coated with an alumina coating. A variety of processes may be used to blanket coat the substrate with alumina. Chemical vapor deposition (CVD), epitaxial deposition, sputtering or evaporation may be used to blanket coat the substrate with the alumina coating. Alternatively, ion beam assist deposition (IBAD) may be used. IBAD is a combination of two distinct operations: physical vapor deposition combined with bombarding the substrate surface with low energy ions. Bombarding the substrate surface with low energy ions allows for good adhesion and high density of the alumina coating. Dielectrics other than alumina may also be used.

Using an IBAD process to coat the substrate with alumina gives pin-hole free layers of alumina, which enhances the overall hermeticity of the layer if hermeticity is desired. In other words, coating the substrate with alumina using the IBAD process prevents the transmission of vapor, moisture, fluids or other elements that would compromise the hermetic integrity of the device.

Once the dielectric layer has been deposited, the aluminum pattern may be removed at step 70. Removal of the aluminum pattern may also be effected by a variety of processes. For example, the entire substrate, including the dielectric, such as, for example, an alumina coating, and the active material, such as, for example, the aluminum pillars and/or other features, may be put into a dissolving solution such as, for example, ferric chloride ($FeCl_3$) or other solution that is strong enough to dissolve the aluminum pillars but mild enough not to attack the alumina coating. Exposing both the pattern and the dielectric layer to a dissolving solution allows the pattern to be dissolved through attack on its sidewalls, which were partially shadowed from the dielectric deposition due to the difference in thickness between the pattern and the dielectric layer. Dissolution of the active material used for the pattern, such as, for example, aluminum, results in the formation of a negative image of the pattern in the deposited dielectric layer.

With the pattern removed, another metalization layer may be patterned and deposited again at step 62. During deposition of this metalization layer, the holes in the dielectric layer that were formed when the pillars were removed at step 70 may be filled such that a conductive path connecting the metalization layers exists through the dielectric layer. The metalization layer may be processed through plating, screen printing, additional vacuum depositions and the like.

Step 64 again queries whether more layers are desired or needed. The process may continue in this fashion until the entire multilayer substrate is fabricated.

The advantages of multilayer substrates formed in accordance with embodiments of the present invention are readily apparent. Because each layer of the multilayer substrate may be formed by depositing alternating dielectric layers and metalization layers on top of one another, or alternatively, successive dielectric layers and metalization layers or vice versa on top of one another, the thickness of each layer and, ultimately, of the entire multilayer substrate may be precisely controlled. Also, because each layer will adhere to the previous layer as a result of the deposition process, there is no need for firing. Thus, shrinkage resulting from the introduction of heat is reduced or eliminated altogether. Moreover, dielectrics of high purity, such as, for example, 99.999% alumina, may be used because there is no firing of the substrate that would compromise the integrity of the dielectric.

The multilayer substrate according to embodiments of the invention described herein may be employed in a variety of capacities. For example, it will be readily apparent to those skilled in the art that a capacitor may be formed from the multilayer substrate. A dielectric layer may be sandwiched in between two metalization layers. By providing the appropriate contacts to the metalization layers, a capacitor is formed as a result of a dielectric existing between two conductors. The specifications of the capacitor may be tightly controlled because of the great control available when forming dielectric layers. For example, a dielectric layer may be deposited as thickly or as thinly as desired in order to effect the specifications required for the capacitor. In addition, the material used for the dielectric layer may be chosen according to the specifications required for the capacitor. For example, it is possible to use 99.999% alumina as the dielectric layer. Such material provides high charge density over a relatively small geometry, thereby making it ideal for applications requiring high charge density in an area of small volume, such as, for example, implantable medical devices.

Figure 7:
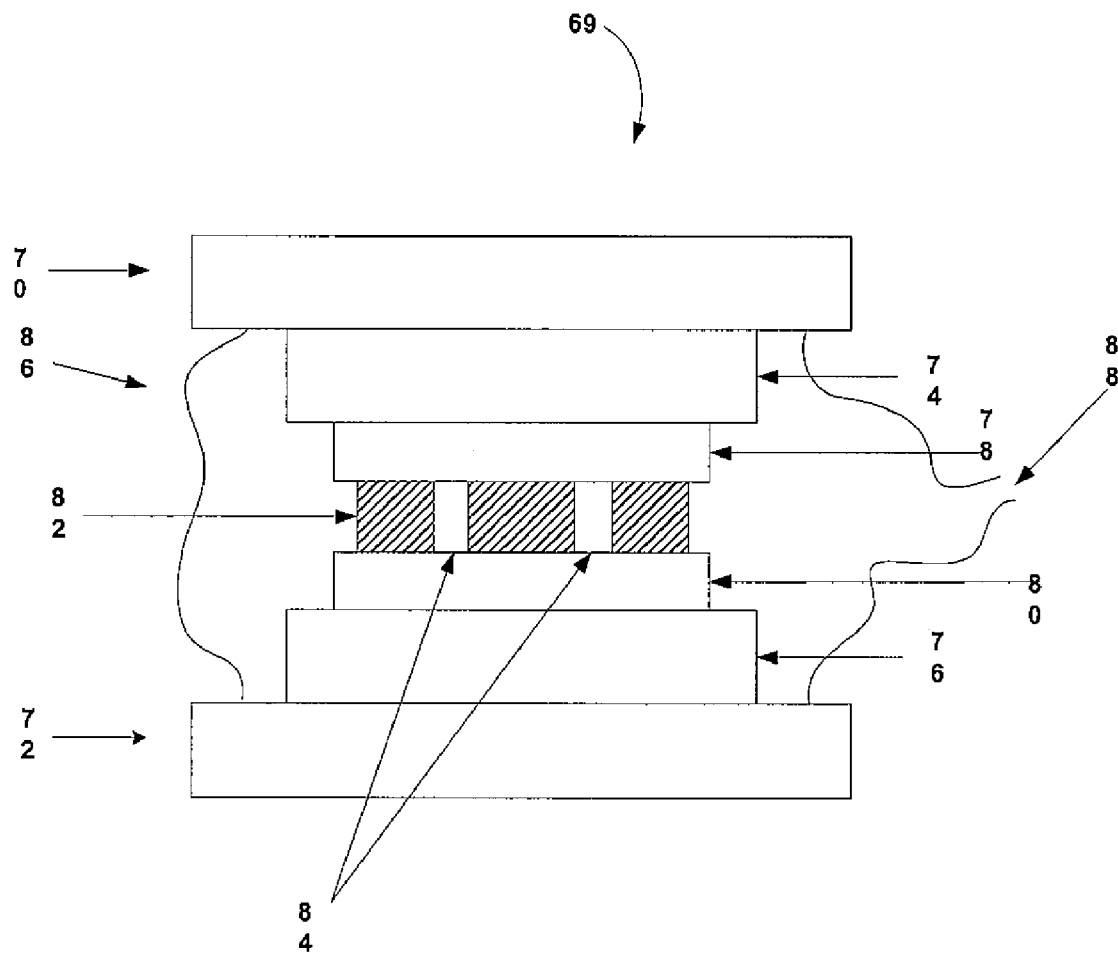
FIG. 7 shows a plan view of an assembly for filling via holes in a substrate to an present embodiment of the invention.

FIG. 7 shows a plan view of an assembly 69 for filling via holes in a substrate according to an embodiment of the invention. The assembly 69 may include a first pressure plate 70, a second pressure plate 72, a first assembly plate 74, a second assembly plate 76, a first printing sheet 78, a second printing sheet 80 and a vacuum enclosure 86. According to an embodiment of the invention, the assembly 69 may be formed as a "sandwich" by stacking the components in a similar configuration around both sides of a substrate 82. As shown in FIG. 7, a substrate 82 having vias 84 is flanked by a first printing sheet 78 on one side of the substrate 82 and a second printing sheet 80 on another side of the substrate 82. Adjacent to the first printing sheet 78 and the second printing sheet 80 are the first assembly plate 74 and the second assembly plate 76, respectively. Following the first assembly plate 74 and the second assembly plate 76 are the first pressure plate 70 and the second pressure plate 72, respectively. A vacuum enclosure 86 may surround the assembly 69.

The pressure plates 70 and 72 and the assembly plates 74 and 76 may be made from metals, plastics, composites and the like. According to an embodiment of the present invention, the pressure plates 70 and 72 may apply up to 1000 lbs. force. The printing sheets 78 and 80 may be made from a variety of materials, such as, for example, foam rubber.

The vacuum enclosure 86 may also be made from a variety of materials, such as, for example, plastic or composites. The vacuum enclosure 86 may be in the form of a bag and may include a port 88 through which the contents of the vacuum enclosure 86 may be evacuated when pulling a vacuum. The port 88 may be fitted with a valve or other mechanism that connects to a pump or other machinery for pulling a vacuum in the vacuum enclosure 86 and creating a vacuum around the substrate 82 and the printing sheets 78 and 80. Other elements of the assembly 69 may be enclosed within the vacuum enclosure 86 as long as the conductive ink to be printed on the substrate 82 is, at some point, exposed to a vacuous environment.

The vacuum enclosure 86 may be arranged on the assembly 69 in a variety of ways. According to an embodiment of the present invention, the vacuum enclosure 86 may be arranged around the assembly plates 74 and 76, printing sheets 78 and 80 and the substrate 82, in between the pressure plates 70 and 72.

According to an embodiment of the present invention, conductive ink or other material used for printing may be included on a portion of the printing sheets 78 and 80 adjacent to the substrate 86. If foam rubber, for example, is used for the printing sheets 78 and 80, a "breathable" side of the foam rubber may be positioned adjacent to the substrate 86 such that when pressure is applied to the pressure plates 70 and 72, the conductive ink is pushed through the vias 88.

Figure 8:
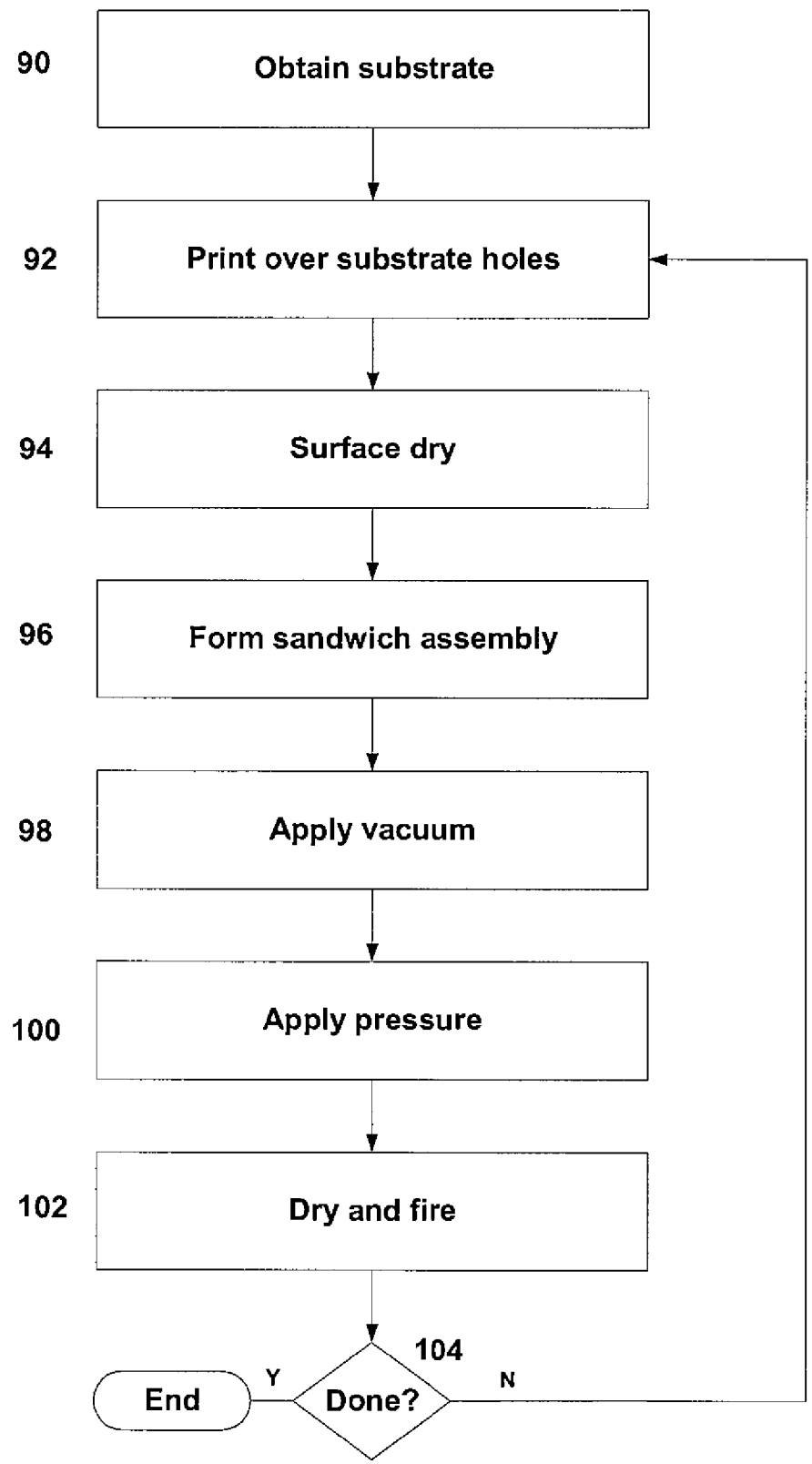
FIG. 8 shows a method for filling via holes in a substrate to an embodiment of the present invention.

A method for filling via holes in a substrate to an embodiment of the present invention is shown in FIG. 8. At step 90, a substrate 86 is obtained. The substrate 86 may be made from any type of substrate material commonly used in the art, such as, for example, ceramic, glass, silicon, gallium arsenide, alumina and the like. The substrate 86 may be a single layer substrate or a multilayer substrate. At step 92, a pattern may be printed over any holes in the substrate 86. The pattern may be printed using any printing technique conventional in the art, such as, for example, thin film or thick film printing techniques. Other techniques common in the art may also be used.

At step 94, a surface dry operation is performed. The surface dry operation dries the conductive ink printed on the substrate 86. The surface dry operation may be performed at different temperatures for different periods of time as long as the time and temperature of the surface dry operation is sufficient to dry the conductive ink that has been printed on the substrate 86. For example, according to an embodiment of the present invention, the surface dry operation may be performed for ten seconds at 70 C.

At step 96, a sandwich assembly 90 is formed. According to an embodiment of the present invention, the sandwich assembly 90 may be formed as shown in FIG. 7. However, any sandwich assembly 90 may be formed as long as it allows conductive ink to be pushed through vias of a substrate and allows for a vacuum enclosure to surround the conductive ink and the substrate.

At step 98, a vacuum is applied. According to an embodiment of the present invention, the contents of an enclosure, such as, for example, the vacuum enclosure 86 surrounding the substrate as shown in FIG. 7, may be evacuated such that an area surrounding the substrate and the printing sheets containing the conductive ink for filling the vias is evacuated. By forming a vacuum about the conductive ink, any air bubbles or pockets that may be located within the conductive ink are removed and air bubbles or pockets that may otherwise form within the conductive ink are precluded from forming. The air bubbles or pockets may be evacuated through the port 88 shown in FIG. 7.

At step 100, pressure is applied to the pressure plates 70 and 72. On the first pass, low pressure is applied for an amount of time adequate to coat the vias 88 of the substrate 86. For example, according to an embodiment of the present invention, pressure may be applied to the pressure plates 70 and 72 for a period of about five minutes. By so doing, the conductive ink existing at the border of the printing sheets 78 and 80 and the substrate 86 will be forced through the vias 88. Because step 100 is performed at low pressure, only enough ink to coat the side walls of the vias 88 is pushed through the vias 88.

At step 102, the substrate 86 is removed from the assembly 69 and dried and fired as is typical in the industry so that the conductive ink bonds properly to the side walls of the via 88. At step 104, the process is repeated if the vias 88 are not yet filled, beginning with printing over the substrate holes at step 92. However, because the vias 88 have already been coated with conductive ink on the second pass through the process, at step 100, during the second pass through, the pressure applied to the pressure plates 70 and 72 is increased so that the vias 88 may be completely filled with conductive ink. According to an embodiment of the present invention, on the second pass through the process, a pressure of 1000 lbs. is applied to the pressure plates 70 and 72 to force enough conductive ink through and into the vias 88 so that the vias 88 become a conductive path form one side of the substrate 86 to another. Screens, stencils and the like may be used for the process. For example, a thick emulsion of 0.001 in or 0.005 stainless steel may be used.

Thus, using embodiments of the present invention as shown in FIGS. 7 and 8, substrates may be fabricated using a combination of vacuum and pressure techniques such that conductive paths through vias on a substrate without air bubbles or pockets in the vias. Using a vacuum to remove air bubbles or pockets or prevent air bubbles or pockets from forming, the via may be a solid and continuous conductive path. As such, it may facilitate forming a hermetic conductive path from one side of the substrate to another side of the substrate. Also, because conductive ink is pushed through the vias using pressure, a vacuum is not needed to pull the conductive ink through the vias as is typical in the art. Using pressure techniques to push conductive ink through substrate vias as disclosed herein according to embodiments of the present invention, the expense associated with vacuum techniques use to pull conductive ink through via substrates because of the wasted conductive ink that is typical in such processes is eliminated. Moreover, process parameters can be optimized be controlling the pressure on the plates, further increasing the efficiency of any substrate fabrication system designed according to embodiments of the present invention.

While particular embodiments of the present invention have been shown and described, it will be obvious to those skilled in the art that the invention is not limited to the particular embodiments shown and described and that changes and modifications may be made without departing from the spirit and scope of the appended claims.

What is claimed is:

1. A method for forming a multilayer substrate comprising:
   obtaining a base substrate;
   forming a first metallization layer on the base substrate without firing;
   the first metallization layer further comprising a metal pattern formed by using a photolithography technique; and
   forming a plurality of alternating dielectric layers and metallization layers over the first metallization layer;
   where a layer of the plurality of dielectric layers is formed by ion beam assist deposition, and a further layer of the plurality of dielectric layers is formed by one of sputtering, vapor deposition, epitaxial deposition and evaporation.

2. The method of claim 1, wherein the further layer of the plurality of dielectric layers is formed by sputtering.

3. The method of claim 1, wherein the further layer of the plurality of dielectric layers is formed by chemical vapor deposition.

4. The method of claim 1, wherein the further layer of the plurality of dielectric layers is formed by epitaxial deposition.

5. The method of claim 1, wherein the further layer of the plurality of dielectric layers is formed by evaporation.

6. The method of claim 1, wherein obtaining a base substrate comprises obtaining a substrate made of a ceramic material.

7. The method of claim 1, wherein the base substrate has two opposite-facing sides and wherein the method further comprising providing an electronic circuit on the first metallization layer on one of the two sides of the base substrate and forming electrodes on the other of the two sides of the base substrate.

8. The method of claim 1, wherein forming the first metallization layer comprises forming the first metallization layer in contact with the base substrate.

9. The method of claim 1, wherein forming the first metallization layer comprises forming the first metallization layer directly on the base substrate and free of any intervening layer between the first metallization layer and the base substrate.

10. The method of claim 1, wherein the first metallization layer with the metal pattern is formed using alternating layers of titanium and platinum.

11. The method of claim 1, wherein the first metallization layer with the metal pattern is fabricated from alternating layers of copper and aluminum.

12. The method of claim 1, wherein the metal pattern corresponds to pins of a integrated circuit.

13. The method of claim 1, wherein the first metallization layer with the metal pattern is formed from two or more layers.

* * * * *